(12) United States Patent
Adler Fonseca D'almeida et al.

(10) Patent No.: US 12,234,669 B2
(45) Date of Patent: Feb. 25, 2025

(54) SYSTEM FOR MOUNTING AND CONTROLLING ACCUMULATORS IN WORKSTATIONS

(71) Applicant: ACUMULADORES MOURA S/A, Belo Jardim (BR)

(72) Inventors: Dean Adler Fonseca D'almeida, Cabedelo (BR); Marcus Aurelius Barros De Oliveira, Belo Jardim (BR); Felipe Macedo Rocha, João Pessoa (BR); Tiago Emerson Teixeira De Araújo, Campina Grande (BR); Marcos Roberto Rodrigues Malveira, Recife (BR); Vinicius Vannucchi Pierre, Recife (BR); Rafael Nunes De Lima, Paulista (BR); Joao Paulo Fernandes Barbosa, Recife (BR); Henrique Figueroa Lacerda, Recife (BR); João Gabriel Machado Da Silva, Vitória de Santo Antão (BR); Spartacus Pereira Pedrosa, Belo Jardim (BR); Washington De Araújo Silva Júnior, Recife (BR); Antonio Gomes Pereira Júnior, Caruaru (BR)

(73) Assignee: ACUMULADORES MOURA S/A, Belo Jardim-Pe (BR)

( * ) Notice: Subject to any disclaimer, the term of this patent is extended or adjusted under 35 U.S.C. 154(b) by 0 days.

(21) Appl. No.: 17/918,428

(22) PCT Filed: Apr. 14, 2021

(86) PCT No.: PCT/BR2021/050153
§ 371 (c)(1),
(2) Date: Oct. 12, 2022

(87) PCT Pub. No.: WO2021/207814
PCT Pub. Date: Oct. 21, 2021

(65) Prior Publication Data
US 2023/0144695 A1    May 11, 2023

(30) Foreign Application Priority Data
Apr. 15, 2020 (BR) .................. 102020007524-1

(51) Int. Cl.
*E05B 47/00* (2006.01)
*G01R 19/00* (2006.01)
(Continued)

(52) U.S. Cl.
CPC ...... *E05B 47/0002* (2013.01); *G01R 19/0084* (2013.01); *H01M 50/262* (2021.01);
(Continued)

(58) Field of Classification Search
CPC . H04Q 1/026; H04Q 1/03; H04Q 1/09; G01R 19/0084; H01M 50/262; E05B 47/0002; E05B 2047/0067
See application file for complete search history.

(56) References Cited

U.S. PATENT DOCUMENTS

| | | | | |
|---|---|---|---|---|
| 5,392,025 A | * | 2/1995 | Figh | ........ G08B 13/14 70/264 |
| 5,745,366 A | * | 4/1998 | Higham | ........ G07F 17/0092 700/242 |

(Continued)

FOREIGN PATENT DOCUMENTS

| | | |
|---|---|---|
| BR | PI1103423 | 3/2014 |
| BR | 202017021778 | 10/2017 |

(Continued)

*Primary Examiner* — Patrick D Hawn
(74) *Attorney, Agent, or Firm* — B. Aaron Schulman, Esq.; Stites & Harbison, PLLC

(57) ABSTRACT

ASSEMBLY AND CONTROL SYSTEM FOR ACCUMULATORS IN WORKSTATIONS, presenting a system
(Continued)

intended for battery control in radio-base stations rack comprising a processing center which controls a switching system, batteries, electromagnetic locks and sensors, in order to prevent non-authorized actions of such batteries inside the racks from occurring.

22 Claims, 6 Drawing Sheets

(51) Int. Cl.
  *H01M 50/262* (2021.01)
  *H04Q 1/02* (2006.01)
(52) U.S. Cl.
  CPC ............... *H04Q 1/026* (2013.01); *H04Q 1/03* (2013.01); *H04Q 1/09* (2013.01); *E05B 2047/0067* (2013.01)

(56) References Cited

U.S. PATENT DOCUMENTS

| | | | | | |
|---|---|---|---|---|---|
| 5,805,456 | A | * | 9/1998 | Higham | G07F 17/0092 312/215 |
| 9,275,505 | B2 | * | 3/2016 | Taylor | G06Q 30/0639 |
| 10,720,034 | B2 | * | 7/2020 | Bergqvist | G08B 21/0213 |
| 11,022,652 | B2 | * | 6/2021 | Kutkut | G01R 31/389 |
| 11,101,517 | B2 | * | 8/2021 | Hummer | H01M 50/209 |
| 2007/0234052 | A1 | * | 10/2007 | Campisi | E05B 67/00 713/169 |
| 2014/0229398 | A1 | * | 8/2014 | Conrardy | G06Q 30/00 705/330 |
| 2017/0346054 | A1 | * | 11/2017 | Elkins | H04Q 1/025 |
| 2018/0034036 | A1 | * | 2/2018 | Perry | H01M 50/576 |
| 2020/0014889 | A1 | * | 1/2020 | Bashkin | G07C 9/00563 |
| 2023/0134890 | A1 | * | 5/2023 | Adler Fonseca D'Almeida | H05K 7/14 361/807 |
| 2023/0143698 | A1 | * | 5/2023 | Adler Fonseca D'Almeida | G08B 13/14 340/636.15 |
| 2023/0202345 | A1 | * | 6/2023 | Yano | H02J 7/0047 307/10.1 |
| 2023/0209022 | A1 | * | 6/2023 | Bashkin | G07C 9/00896 705/28 |

FOREIGN PATENT DOCUMENTS

| | | | | |
|---|---|---|---|---|
| BR | 102016013149 | | 12/2017 | |
| CN | 210042529 | U | 2/2020 | |
| CN | 110890493 | | 3/2020 | |
| DE | 102004013369 | A1 * | 10/2005 | ........... E05B 1/0092 |
| JP | WO2020174712 | A1 * | 3/2021 | ........... G01R 31/371 |
| WO | WO-2014019771 | A1 * | 2/2014 | ......... G01R 31/3689 |

\* cited by examiner

SYSTEM FOR MOUNTING AND CONTROLLING ACCUMULATORS IN WORKSTATIONS

FIELD OF APPLICATION

This invention is comprised in the field of application of electric accumulators, more precisely in the field of fixation, assembly and control systems for electric accumulators in workstations.

The invention comprises a fixation system for electric accumulators in radio-base stations racks, comprising a processing center, at least one electric accumulator, presence sensors, electromagnetic locks, backup power supply system and audible alarms, being that this invention is intended to inhibit the theft of electric accumulators, as well as to record the installation, replacement and maintenance actions in the radio-base stations.

DESCRIPTION OF THE STATE-OF-THE-ART

The use of battery packs as a secondary power supply has a great variety of applications, from the domestic use to the most different fields in the industry. Such battery packs are the uninterrupted power supplies or UPS, commonly referred to as No-Breaks.

In the telecommunication market, one of the main challenges involving the management of Radio-Base Stations (RBSs) is the continuous thefts of the UPS system's batteries. A number of RBSs are installed in the field and/or in distant places and without continuous vigilance, making the UPSs batteries to be frequently stolen for use in vehicle audio systems, resale to other consumers or even for sales as scrap.

The telecommunication companies are estimated to suffer losses in the order of 30% of their battery farm, generating several problems, both in the purchase of new parts and work for field replacement and, in addition, the non-immediate replacement may cause failure and interruption of the RBS operation, resulting in fines and sanctions by the regulatory agencies.

In order to prevent this type of problem, there are some lines of action which can be implemented, such as, for example, inhibiting the theft by means of solutions intended to prevent or deter the removal of the battery from the RBS environment; disabling the battery operation by means of solutions to disable its operation, partially or permanently, upon the identification of a theft attempt; or, further, track the battery by means of a tracking solution, whether geo-referenced of not, allowing to identify the battery location, and recover the asset and find the infringers.

Of the three solutions indicated above, the most feasible one, both economically and concerning its implementation, is to inhibit the theft, once the partial or total disabling of the battery still generates costs for replacing it, and tracking is difficult to be implemented once the recovery requires the use of police force.

The theft inhibition systems normally include the implementation of audible alarms in the RBSs. However, such solution is poorly efficient, because many RBSs are installed in distant places, making the access difficult and the alarm to be inefficient.

In order to prevent the battery from being stolen, ways to mechanically fix the battery into the RBS' locker or cabinet are normally used, whether by using resins or locking mechanisms.

The use of resins to fix the battery into the cabinet make it difficult or even prevents its replacement if needed, and, thus, it's a difficult to implement solution and hardly used.

The use of mechanical locks is efficient, but it causes some difficulties in case the battery requires replacement, because for the mechanical fixation is efficient, it cannot be exposed, so as to prevent violation by an infringer. Thus, the mechanical locks positioning and assembly also make the battery removal difficult by the technician in case of maintenance.

Thus, the state-of-the-art would benefit from a solution which presented a battery locking system in a UPS system which would be easy to implement and allow its removal by an authorized individual, as well as to record the maintenance and replacement actions in a safe electronic environment.

BRIEF DESCRIPTION OF THE INVENTION

This invention is intended to present an assembly and control system for stationary batteries in radio-base stations, being that the system is managed by a processing center responsible for the entire operation.

This invention is also intended to present a battery system provided with metal elements in its rear portion and a set of electromagnets responsible for fixing such batteries to the RBSs' racks.

This invention is further intended to present a power supply switching system, provided with a voltage meter and backup power supplies, where such switching system allows the electromagnets set supply even if the RBSs' electric busbars are not energized.

Finally, another objective of this invention is to present a system comprising sensors and audible alarms which assist in the identification of possible failures or theft attempts in the RBSs.

BRIEF DESCRIPTION OF THE DRAWINGS

The subject matter object of this Invention will be fully clear in its technical aspects from the detailed description which will be made based on the figures listed below, on which

DETAILED DESCRIPTION OF THE INVENTION

Figure 1:
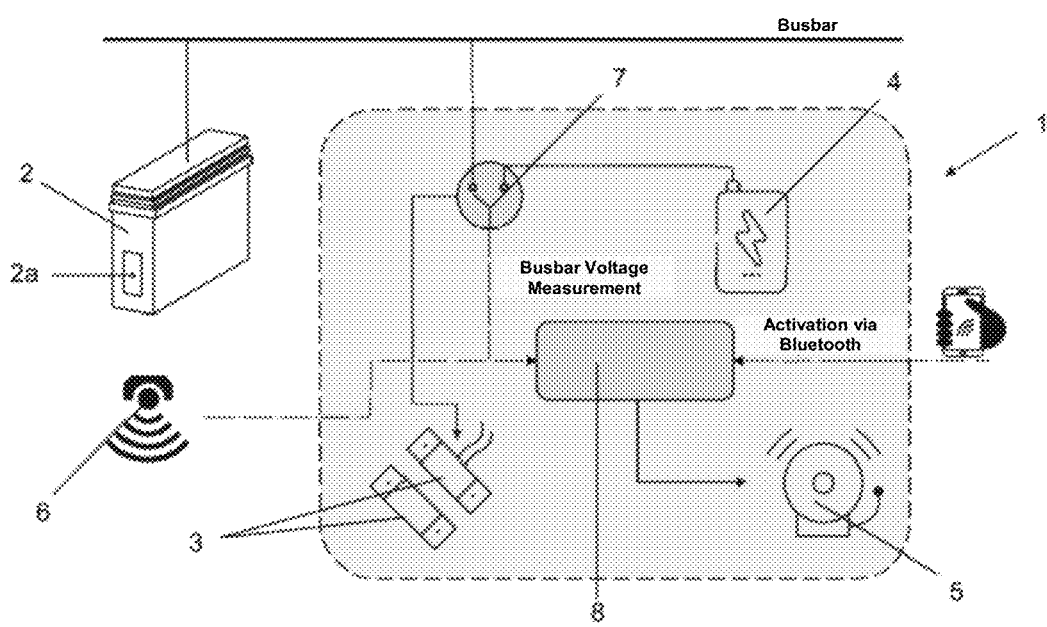
FIG. 1 presents a schematic view of the assembly and control system for accumulators in workstations.
Figure 2:
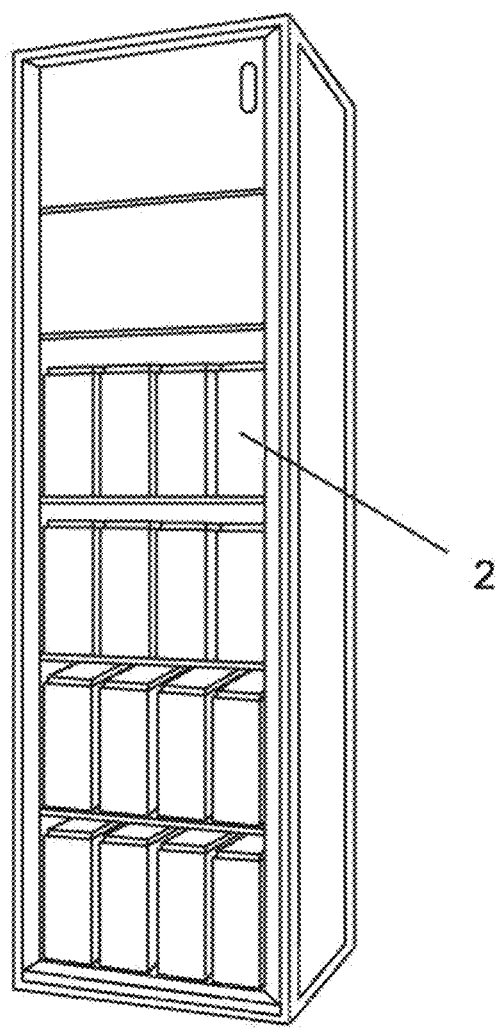
FIG. 2 presents a perspective front view of a RBS rack.
Figure 3:
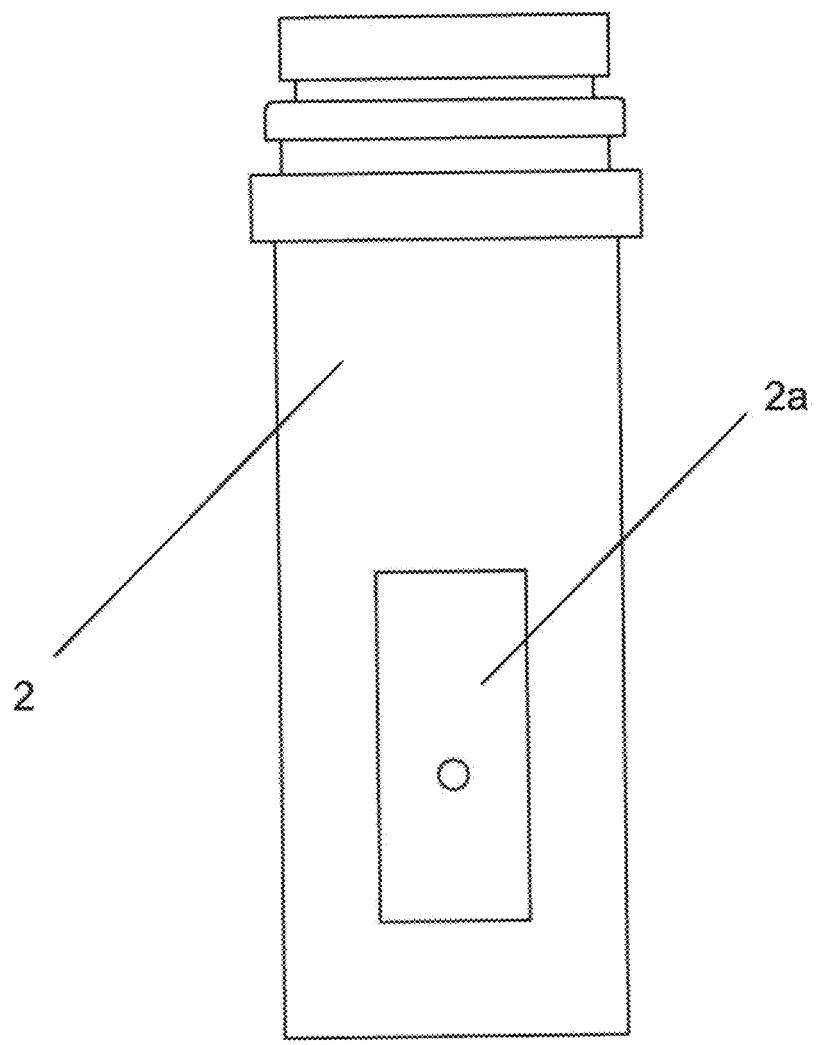
FIG. 3 presents a rear view of a stationary battery for use in an assembly and control system for accumulators in workstations.
Figure 4:
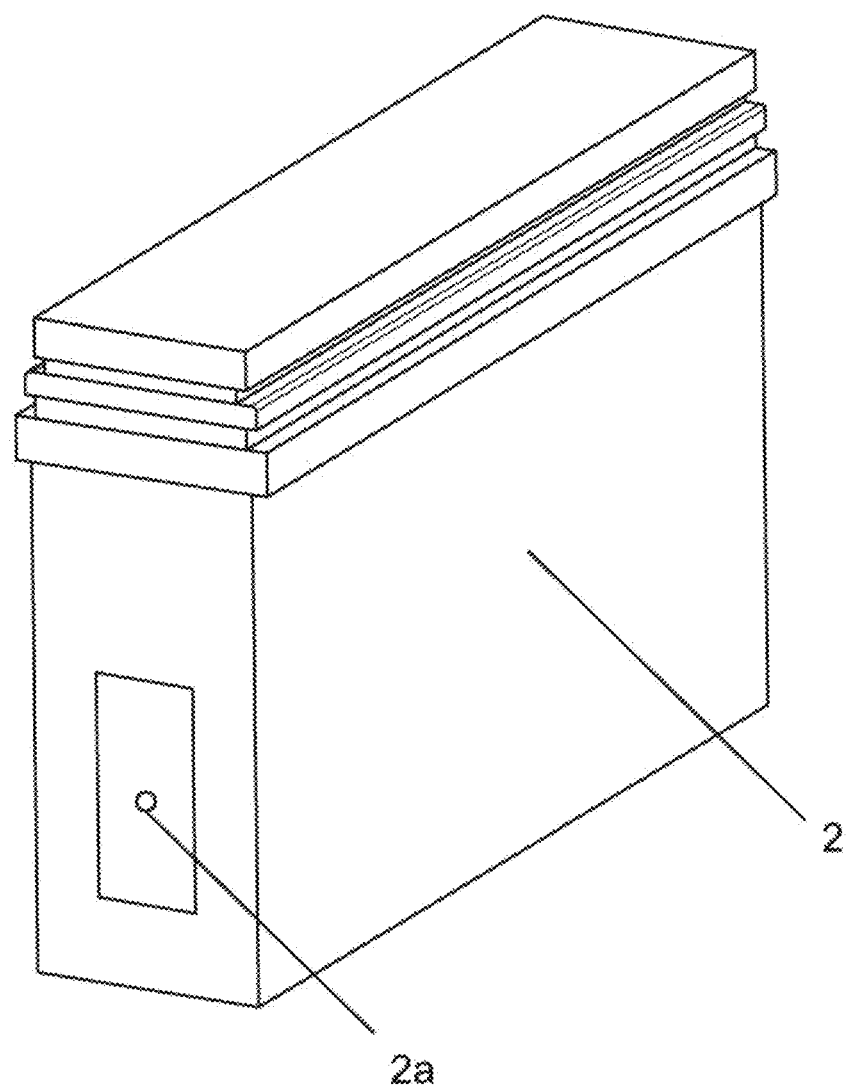
FIG. 4 presents a perspective view of a stationary battery for use in an assembly and control system for accumulators in workstations.
Figure 5:
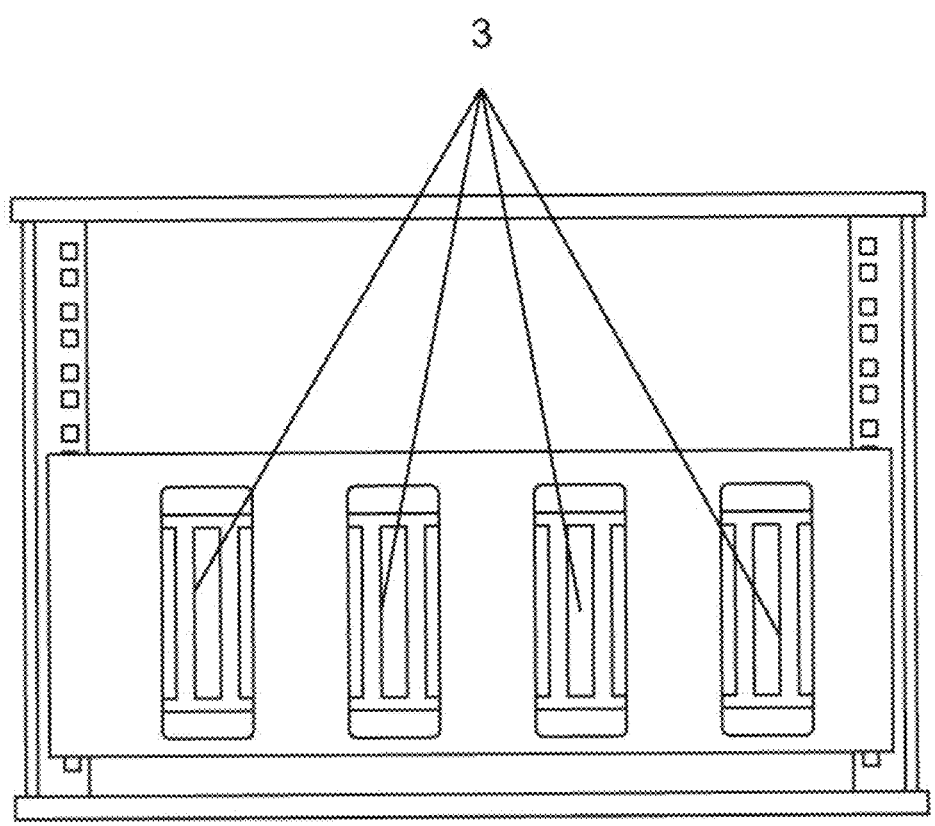
FIG. 5 presents a detailed view of the inner rear portion of the RBS rack, showing the electromagnetic locks of the assembly and control system for accumulators in workstations.
Figure 6:
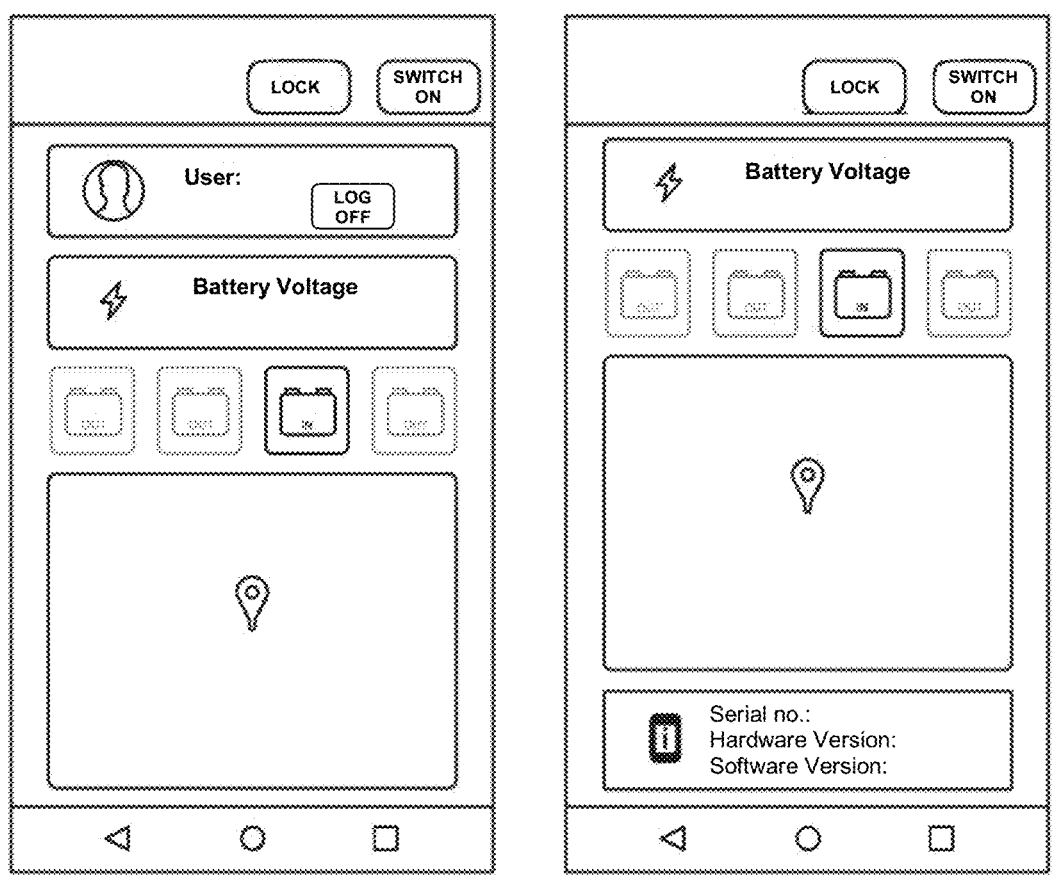
FIG. 6 presents estimated views of the screen of the device connected to the control center, as well as the fields monitored by the implementation of the assembly and control system for accumulators in workstations.

In compliance with the objectives presented by means of the brief description, this patent application "ASSEMBLY AND CONTROL SYSTEM FOR ACCUMULATORS IN WORKSTATIONS", presents a system (1) comprising at least one battery (2), preferably stationary; at least one electromagnetic lock (3); a backup power supply (4); at least one audible sensor (5); at least one presence sensor (6); a switching system (7); being that all these items are connected to a processing center (8).

The system (1) batteries (2) are elements requiring control and management by the system (1), such management being executed by the processing center (8), so that the batteries (2) are considered as passive elements.

In their construction, the batteries (2) receive a ferromagnetic element (2a) installed in their housing, preferably in their rear portion, to better use the space upon installation in the radio-base station rack, without preventing the installation of the ferromagnetic element (2a) in another portion of the referred batteries' (2) housing. The installation of the ferromagnetic element (2a) occurs after their formation and sealing process, respecting the batteries' (2) size limits, i.e., without exceeding the width and height limits of the installation face, cooperating to better use the radio-base station rack's inner space.

The electromagnetic locks (3), in their turn, are installed in the inner portion of the ratio-base station, preferably in its inner rear portion, being that the amount of electromagnetic locks (3) will be the same as the quantity of batteries (2), once each electromagnetic lock (3) will fix one battery (2).

The electromagnetic locks (3) are constructed by means of electromagnetic magnets which, once energized by means of their electromagnetic field, will fix the ferromagnetic element (2a) installed in the battery (2) housing, so that the referred battery (2) cannot be removed until the electromagnetic lock (3) is de-energized, thus guaranteeing its inviolability and, consequently, preventing a of non-authorized removal action, such as, for example, a theft.

The electromagnetic locks (3) will be electrically powered by means of a switching system (7). The switching system (7), in its turn, comprises an electrical connection to the radio-base station rack power supply busbar and another electric supply connection to a backup power supply (4) and, further, a sensor for measuring the radio-base station rack busbar voltage.

The switching system (7) is responsible for guaranteeing the continuous power supply of the electromagnetic locks (3), being that such power supply will be primarily provided by the radio-base station rack's electric busbar. In case or involuntary or purposeful de-energization of the radio-base station rack, the switching system (7) will automatically identify such power shortage by means of the voltage measurement sensor and will also automatically switch the electromagnetic locks power supply to the backup power supply (4). Such backup power supply (4) is preferably a battery.

The switching system (7) is directly controlled by the processing center (8), therefore, all the other system components are managed by the referred processing center (8) once such components' power supply is provided by the switching system (7).

The processing center (8) is provided with a remote communication system, preferably of bluetooth low energy type, without prejudice of using another remote communication protocol such as, for example, NFC, Wi-Fi or others, provided they allow the communication with a cellular device interconnected to the operators' databases, such interconnection being conducted by means of connection with a cloud-type system.

Thus, the processing center (8) is able to receive the maintenance requests, battery exchange or other scheduled services, directly from the databases of the respective radio-base station rack's operators, as well as to report such actions, as well as possible failures occurred in the system (1).

For that purpose, in addition to the voltage sensor present in the switching system (7), the processing center (8) is provided with a presence sensor along with each electromagnetic switch (3), being that such presence sensor indicates the correct positioning or absence of the battery (2). The processing center (8) is further provided with a radio-base station rack door opening sensor, being that such sensor monitors when the radio-base station rack's door is open or closed.

In case of indication of non-authorized opening of the radio-base station rack's door or indication of absence of battery by the electromagnetic lock's (3) presence sensor, an audible warning by means of an audible sensor (5) is triggered, as well as a computer alert transmitted by the processing center (8) to the database of the radio-base station rack operator.

The processing center (8) is also installed in the inner portion of the radio-base station rack, preferably in its inner rear portion, so as to prevent any attempt to violate the same.

There's a number of advantages of suing the system (1) compared to the other solutions existing in the state-of-the-art, being its effectiveness against thefts and it low cost the most important ones.

The effectiveness of using the system (1) compared to the other solutions existing in the state-of-the-art is the fact that it provides a continuous power supply to the electromagnetic locks (3), so that it protects the batteries (2) against external actions, such as, for example, the radio-base station rack de-energization, as well as an internal violation by means of the electromagnetic lock itself.

In its turn, its cost is verified by the simple installation of a ferromagnetic element (2a) in the battery (2) and the use of electromagnetic locks, also with a reduced economic value, being that such elements do not disable the batteries (2) in case of possible theft attempts, as well as they do not require police actions to recover them.

It should be understood that this description does not limit the implementation to the details described herein and that the invention is capable of other modalities and to be practiced or executed in a variety of modes, within the scope of the claims. Although specific terms have been used, such terms must be construed on a generic and descriptive sense, and not with a limiting purpose.

The invention claimed is:

1. An assembly and control system for combatting and preventing the theft of an energy accumulator installed in a radio-based station rack in an outdoor environment, said assembly and control system comprising:
   (a) at least one battery to be protected installed in a radio-base station rack;
   (b) at least one electromagnetic lock configured so that said at least one battery cannot be removed until said at least one electromagnetic lock is de-energized;
   (c) a backup power supply;
   (d) at least one audible sensor;
   (e) at least one presence sensor;
   (f) a switching system that electrically powers said at least one electromagnetic lock, said switching system comprising (1) an electrical connection to a rack busbar (2) an electrical connection to said backup power supply, and (3) a sensor for measuring voltage of said rack busbar; and (g) a processing center controlling activation and deactivation of the at least one electromagnetic lock, wherein when a signal is received from the at least one presence sensor indicating the absence of the battery to be protected, an audible warning is triggered by said at least one audible sensor to an operations center in order to combat or prevent the theft of the energy accumulator.

2. The system according to claim 1, wherein the at least one battery further comprises a housing and a ferromagnetic element installed in said housing.

3. The system according to claim 2, wherein the ferromagnetic element is installed in a rear portion of the at least one battery.

4. The system according to claim 2, wherein the ferromagnetic element is configured to fit within a portion of the at least one battery and does not exceed the width and height limits of an installation face.

5. The system according to claim 1, wherein the at least one electromagnetic lock is constructed with electromagnetic magnets.

6. The system according to claim 2, wherein the at least one battery is attached to the at least one electromagnetic lock.

7. The system according to claim 5, wherein the at least one electromagnetic lock is installed in an inner portion of the radio-base station rack.

8. The system according to claim 1, wherein the number of the at least one electromagnetic lock will be equal to the number of the at least one battery.

9. The system according to claim 8, wherein each electromagnetic lock will fix one battery.

10. The system according to claim 1, wherein the backup power supply is a battery.

11. The system according to claim 1, wherein the switching system is directly controlled by the processing center.

12. The system according to claim 1, wherein the processing center is provided with a remote communication system connected by Bluetooth, NFC or Wi-Fi.

13. The system, according to claim 12, wherein the processing center communicates with a device interconnected to a database databases, and is connected to a cloud system.

14. The system according to claim 1, wherein the presence sensor indicates correct positioning or an absence of the battery.

15. The system according to claim 12, wherein the processing center is provided with a radio-base station rack door opening sensor.

16. The system according to claim 15, wherein the radio-base station rack door opening sensor monitors when the radio-base station rack door is open or closed.

17. The system according to claim 12, wherein the processing center is installed in an inner portion of the radio-base station rack.

18. The system according to claim 1, wherein the at least one electromagnetic lock is installed in an inner rear portion of the radio-base station rack.

19. The system according to claim 12, wherein the processing center is installed in an inner rear portion of the radio-base station rack.

20. The system according to claim 1, wherein the presence sensor indicates unauthorized access to the radio-base station rack.

21. The system according to claim 1 wherein the system is capable of protecting one or more batteries.

22. The system according to claim 1, wherein the backup power supply is connected to the at least one battery.

* * * * *